United States Patent [19]

Frisch et al.

[11] Patent Number: 4,837,129
[45] Date of Patent: Jun. 6, 1989

[54] PROCESS FOR PRODUCING CONDUCTOR PATTERNS ON THREE DIMENSIONAL ARTICLES

[75] Inventors: David C. Frisch, Baldwin, N.Y.; Louis T. Manzione, Summit; Gerhard W. Poelzing, New Providence, both of N.J.; Wilhelm Weber, Hicksville, N.Y.

[73] Assignees: Kollmorgen Corp., Dallas, Tex.; Bell Telephone Laboratories, Incorporated, Murray Hill, N.J.

[21] Appl. No.: 928,673

[22] Filed: Nov. 7, 1986

Related U.S. Application Data

[63] Continuation of Ser. No. 650,760, Sep. 14, 1984, abandoned.

[51] Int. Cl.$^4$ .............................. G03C 5/16
[52] U.S. Cl. ................... 430/319; 430/296; 430/311; 430/942; 430/967
[58] Field of Search ............ 430/311, 296, 319, 273, 430/967, 942

[56] References Cited

U.S. PATENT DOCUMENTS

| | | | |
|---|---|---|---|
| 3,259,559 | 7/1966 | Schneble et al. | 204/38 |
| 3,772,056 | 11/1973 | Polichette et al. | 117/47 A |
| 3,772,078 | 11/1973 | Polichette et al. | 116/212 |
| 3,907,621 | 9/1975 | Polichette et al. | 156/18 |
| 3,925,578 | 12/1975 | Polichette et al. | 427/304 |
| 3,930,963 | 1/1976 | Polichette et al. | 204/15 |
| 3,993,802 | 11/1976 | Polichette et al. | 427/98 |
| 3,994,727 | 11/1976 | Polichette et al. | 430/4 |
| 4,260,670 | 4/1981 | Burns | 430/5 |
| 4,448,865 | 5/1984 | Bohlen et al. | 430/5 |

OTHER PUBLICATIONS

Paterson, "Automask: A Method to Image on a Photosensitized 3-Dimensional Object", Motorola, TDB, vol. 1(1), Aug. 1980, pp. 24–25.
Engelmaier et al, "Injection Molding Shapes New Dimensions for Boards", Electronics, Dec. 15, 1982.
"Molded PC Boards", Plastics World, May 1983.
"Molded Thermoplastics PWBs: Multifunctional 3-D Boards are (finally) Here," E. Galli, *Plastics Design Forum*, May/Jun. 1984, (6 sheets).
Introduction to Printed Circuits, Robert L. Swiggett, John F. Rider Publisher, Inc., NY, NY (1958) pp. 49 & 51.

*Primary Examiner*—José G. Dees
*Attorney, Agent, or Firm*—Morgan & Finnegan

[57] ABSTRACT

An article comprised of a body having a conductor pattern on at least one non-planar and non-flexible surface thereof. The article is prepared by using a three-dimensional mask having an interior surface which is a mirror image replica of the surface of the body on which the conductors are to be formed. The surface of the body is provided with material which is capable of initiating conductor formation. The interior surface of the mask then is placed over the body and in substantial registry therewith. The mask and the body then are exposed to radiation or moving material to delineate the conductor pattern. Subsequently, the mask is removed and conductors are formed.

8 Claims, 3 Drawing Sheets

PROCESS FOR PRODUCING CONDUCTOR PATTERNS ON THREE DIMENSIONAL ARTICLES

This is a continuation of co-pending application Ser. No. 06/650,760, filed on Sept. 14, 1984, now abandoned.

FIELD OF THE INVENTION

This invention relates to three-dimensional articles containing conductive patterns, and to printed circuits in particular.

BACKGROUND OF THE INVENTION

A need has existed for a long time in the electronic packaging industry for a relatively simple, reliable and economical process for forming conductive patterns on non-planar and/or irregular surfaces. It has been desired to be able to form conductive patterns on both interior and exterior surfaces of non-planar and/or irregular bases. Screen printing has been suggested for applying conductive patterns to a non-planar but regular surface, such as the outer surface of a cylinder. A screen stencil was held up against the outer surface of the cylinder while the cylinder was rotated. Images then were formed on a part of the outer surface of the cylinder as it was rotated. A conductive pattern was formed from these images. However, screen printing techniques are difficult to apply to non-planar and/or irregular surfaces because it is difficult to keep the screen in contact with the non-planar and/or irregular surface.

Flexible printed circuits have been used in a limited number of applications to form conductive patterns on non-planar surfaces. These flexible printed circuits have limited flexibility. Also, the flexible printed circuit does not become as rigid as is needed in many applications.

Printed circuits have been formed on planar surfaces of materials such as nylon cloth, reinforced epoxy resins, which can be deformed into a limited number of shapes by the application of heat and pressure to the material. This deformation tends to cause the conductive patterns to rupture on the deformed outer surfaces and to wrinkle and delaminate from the base material on the inside of the deformed surfaces.

Today's printed circuit boards are essentially planar with conductive patterns on one or more parallel planes, the patterns being formed by the use of a glass or mylar type planar mask. Interconnection between the parallel planes is achieved via plated through holes. The planar surface of the board typically first is coated with a photosensitive material and then the planar mask, which contains the conductor pattern, is placed over and in contact with the board. The mask then is exposed to light or other radiation. This causes selected exposed portions of the photosensitive material to be altered in a variety of different known ways. The mask then is removed and the non-exposed portions of the photosensitive material are removed using a variety of different, known chemical etch processes. This leaves only the exposed portions of the photosensitive material that define the desired conductor pattern. Conductors are formed in the exposed or non-exposed portions of the surface of the board to form a conductor pattern. However, a planar mask cannot be effectively used to form conductive patterns on a non-planar and/or irregular surface of a printed circuit. The use of a planar mask on a non-planar surface results in some conductors which have greater or less than the desired widths and loss of control over the delineation of the desired conductive pattern.

It is desirable in many applications to be able to simultaneously form a plurality of conductors on an article having non-planar and/or irregular surfaces as well as planar surfaces.

SUMMARY OF INVENTION

In one aspect the present invention is directed to a process for forming a conduit pattern on at least one non-planar surface of a body which is adapted to be receptive to the formation of the conduit pattern comprising the steps of:

providing a mask having a non-planar surface which is essentially a mirror image replica of the non-planar surface topography of a corresponding portion of the body on which the conduit pattern is to be formed, the mask having a preselected pattern which corresponds to the desired conduit pattern;

placing the mirror image replica surface of the mask substantially in registry with the corresponding surface portion of the body; and causing the preselected pattern on the mask to be essentially replicated on the surface of the body.

The use of a three dimensional mask allows a conductor pattern to be formed on most articles even if the articles have non-planar and/or irregular surfaces. This provides for cost effective electronic packaging wherein molded-in features eliminate secondary manufacturing operations. A desired conductive pattern readily can be formed on an available non-planar and/or irregular surface of an article itself employing the process of this invention.

Another aspect of the present invention is directed to an article comprised of a body having a conduit pattern on at least one essentially irregular and essentially non-flexible surface thereof, the widths of conductors of the conduit pattern essentially corresponding to design widths of the conductors.

These and other features and advantages of the present invention are better understood from a consideration of the following detailed description taken in conjunction with the accompanied drawings.

BRIEF DESCRIPTION OF DRAWINGS

FIG's 1A, 1B, 1C, And 1D illustrate various views of one embodiment of the present invention; and FIG's 2 and 3 illustrate masks useful to produce the embodiment of FIG's 1A, 1B, 1C, and 1D.

DETAILED DESCRIPTION

Figure 1A:
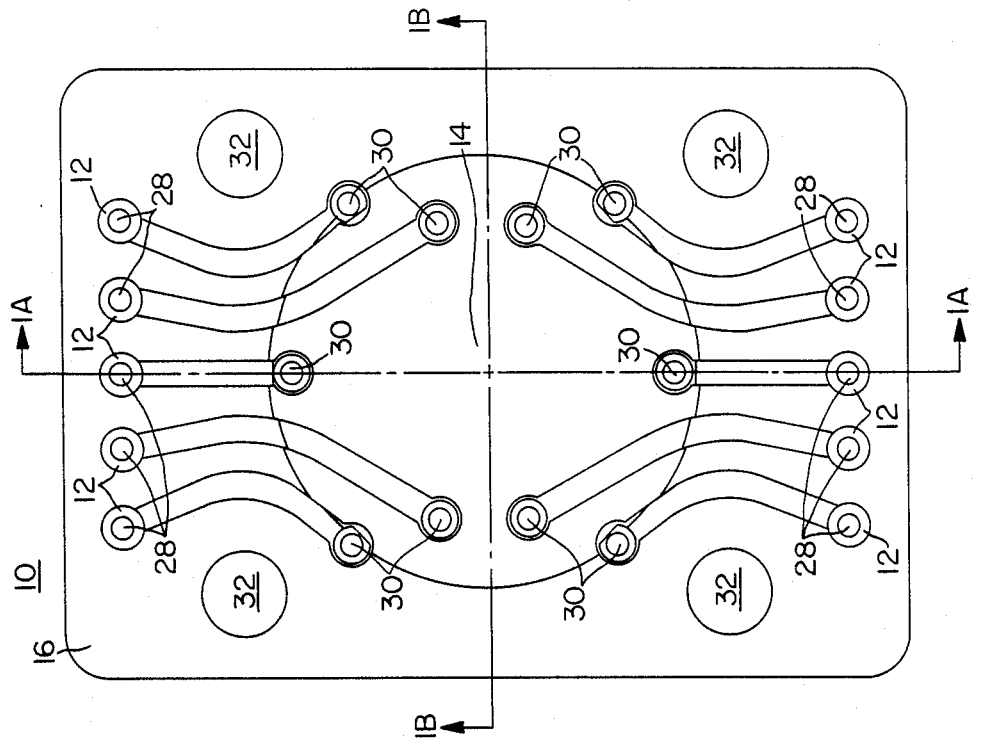
Figure 1B:
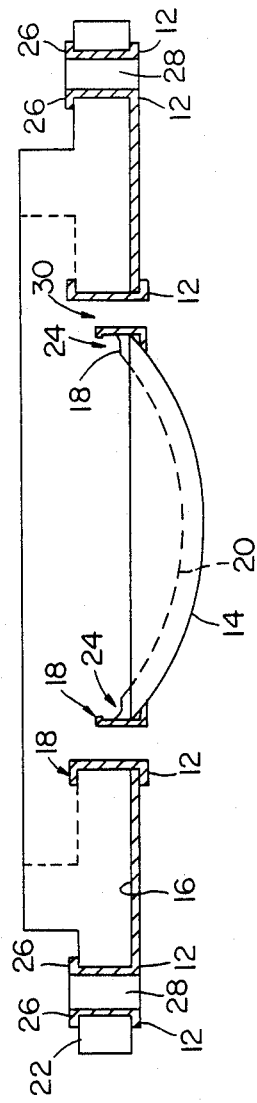
Figure 1C:
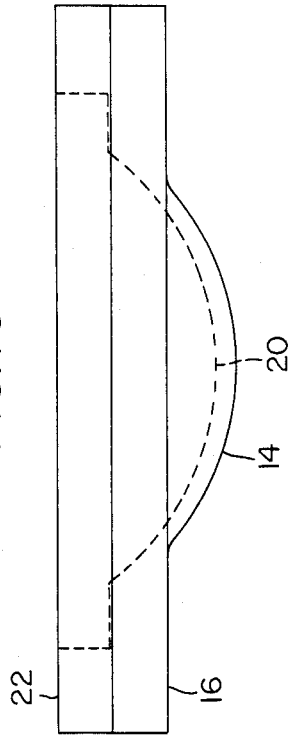
Figure 1D:
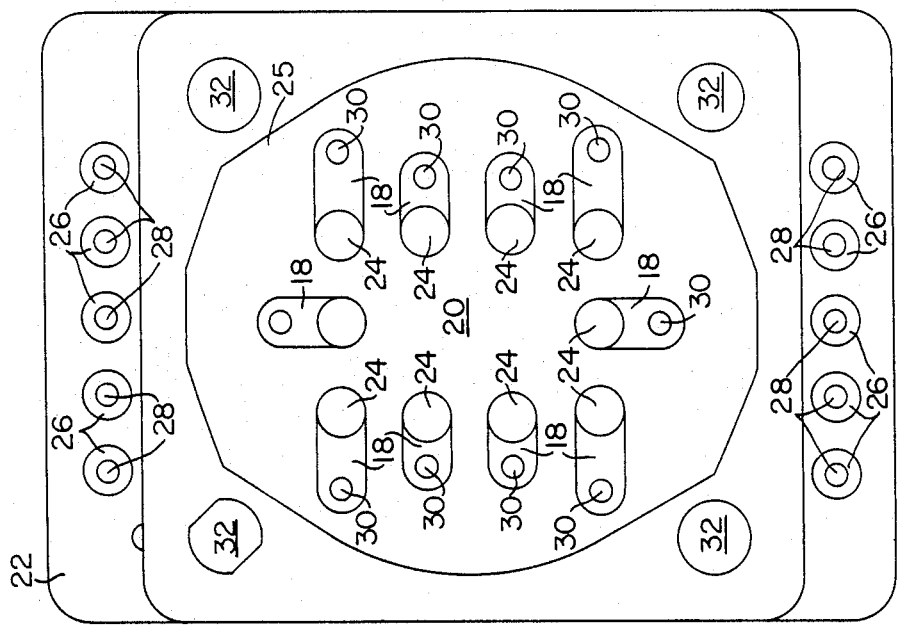

Referring now to FIGS. 1A, 1B, 1C and 1D, there is illustrated a top view of the first surface, a first cross-sectional view taken along axis A—A of the first surface, a second cross-sectional view taken along axis B—B of the first surface, and a top view of a second surface, respectively, of a base member 10 of a joy stick (not illustrated) which has a first plurality of metallic conductors 12 (which may be denoted as conduits) on the first surface (see FIG. 1A) and a second plurality of metallic conductors 18 (which may be denoted as conduits) on the second surface (see FIG. 1D). Base member 10 has on the first surface (see FIG. 1A) a portion of a substantially spherical convex surface 14 and a substantially planar portion 16. Base member 10 has on the second surface a substantially spherical concave portion 20 and a substantially planar portion 22. Spherical portions 14 and 20 are essentially mirror images of one another. An ellipsoidal region 15 surrounds spherical portion 25.

Each of conductors 12 has two ends. One end of each has a hole 30 which extends through to surface 2. Metal extends through all of holes 40 and thus couples one end of each conductor 12 to one end of one conductor 18. A second end of each of conductors 12 is coupled through a hole 28 to a separate one of conductors 26 on the second surface. Portions of each of conductors 18 on the second surface terminate in a separate one of a group of substantially spherical concave portions 24 which are formed in portions of spherical member 20. Non-plate I through hole 32 are illustrated.

Figure 2:
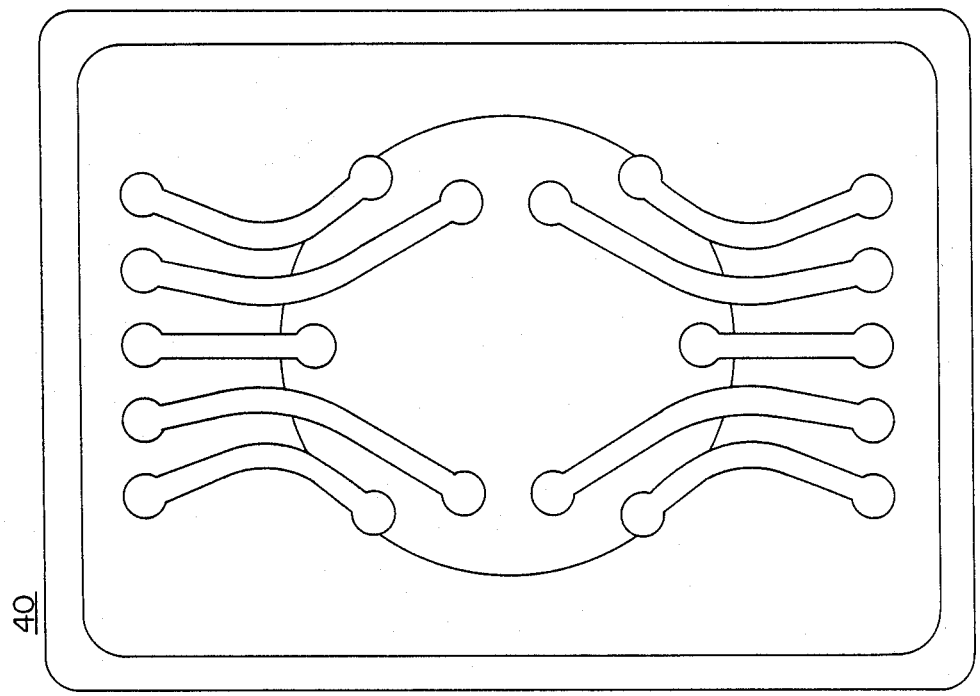
Figure 3:
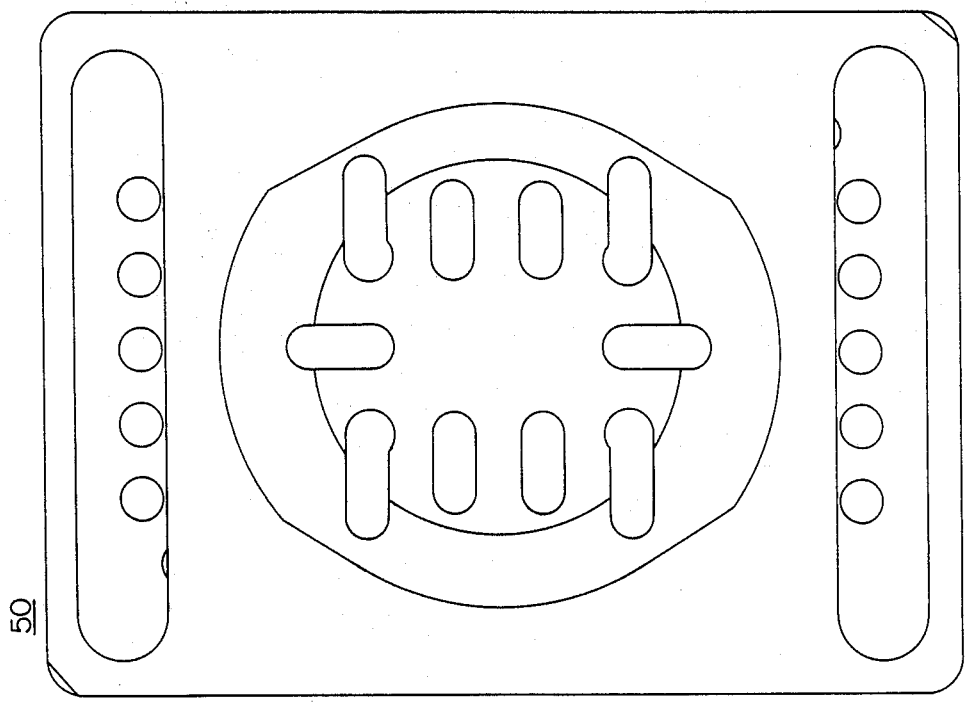

Referring now to FIG. 2, there is illustrated a mask 40 which can be used to define the conductors 12 of FIG. 1A. The reverse side (not illustrated) of mask 30 is designed to essentially have the same shape as the first surface of base member 10 (see FIG. 1A). Mask 40 fits over the first surface of base member 10 in substantial registry therewith and thus leaves exposed portions of the first surface of base member 10 in which conductors are illustrated. Referring now to FIG. 3, there is illustrated a mask 50 which can be used to define conductors 30 of base member 10 of FIG. 1D. The reverse side (not illustrated) of mask 50 is designed to have essentially the same shape as the second surface of base 10 (see FIG. 1D). Mask 50 fits over the second surface of base member 10 in substantial registry therewith and thus leaves exposed portions of the second surface of base member 10 which conductors are illustrated. Base member 10, though illustrated in FIGS. 1A and 1B as having conductors, initially does not have same. Starting with base member 10 without metal conductors, a photosensitive catalyst is applied to the first and second surfaces. Masks 40 and 50 then are placed against the first and second surfaces, respectively. Both surfaces, with the respective masks in place, then are exposed to light which is typically ultra violet. This causes the catalyst exposed to the light through open areas in masks 40 and 50 to chemically change its properties. Masks 40 and 50 then are removed. Base member 10 then is exposed to a chemical solution which removes the portion of non-exposed catalyst from the first and second surfaces and leaves the exposed portions of the catalyst on both surfaces. Now the remaining catalyst portions have metallic conductors formed thereon which essentially cover all of the remaining portions of the catalyst and plate through all of holes 28 and 30.

A preselected pattern may be applied on the mask by fully machining; by electroforming over the body and finish machining the pattern; by metal casting over the body and finish machining the pattern; by metal spraying on the body, removing the sprayed on metal finish machining the pattern; or by molding the mask containing the preselected pattern.

Suitable mask materials including metal such as aluminum, steel, brass and copper, which can be fully machined into a conforming mask; plastics which can be cast into a conforming mask such as silicones, epoxy resins, polyester resins; metals which can be electroformed into a conforming mask such as copper and nickle; metals which can be sprayed onto the body including solder compounds such as tin-lead alloy; and known moldable plastics.

The article produced by the process of this invention is comprised of a body having a conduit pattern on at least one non-planar and non-flexible surface thereof. By "non-planar" surface as used throughout the specification and claims herein is meant a surface whose surface topography varies at least 1 mm from its highest point to its lowest point. By "irregular" surface as used throughout the specification and claims herein is meant a surface whose features have complex geometric shapes.

By "conductor width" is meant the observable width of a conductor at any point chosen at random on the metallized article, such as on a printed board, normally viewed from vertically above, as defined in "Terms and Definitions for Interconnecting and Packaging Electronic Circuits", ANSI/IPC-T-50B revised June, 1980 and approved Aug. 11, 1980 by the American National Standards Institute. By "design width of a conductor" as used herein is meant the width of a conductor as delineated or noted on the master drawing, i.e., the desired width, as defined in the aforementioned ANSI/IPC-T-50B publication.

The surface of the body is adapted to be receptive to the formation of a conduit pattern by adhesion promotion, a technique well known to those skilled in the art. The mask is placed in substantial registry with the corresponding surface portion of the body and the preselected pattern on the mask is caused to be replicated on the surface of the body by exposing the mask to moving matter such as ion beam or to radiation such as electromagnetic radiation selected from an electron beam, light (e.g., ultraviolet), and X-ray.

EXAMPLE 1

In a typical embodiment, denoted as Example 1, the base member 10 of FIGS. 1A and 1D was fabricated using an injection molding process with the base material being polysulfone resin.

The molded base was stressed relieved by the procedures taught in D.C. Frisch et al., U.S. Pat. No. 4,339,303 which is incorporated by reference. The stress relief was accomplished by exposing the base to microwave radiation at approximately 2500 mHz for about 10 minutes in microwave oven (commercially available as Sanyo Model HA500). After stress relief, the molded base was normalized by holding at room temperature for one hour. The molded base then was adapted to be receptive for the formation of conductive patterns by adhesion promotion of the polysulfone base and application of reducible metal salt compositions to the adhesion promoted molded base.

The base was adhesion promoted by:

1. Swelling the base by immersion in dimethylformamide-water solution (specific gravity of 0.955614 0.965) for two minutes.

2. Immerse the base for one minute in a hot (60° C.) surfactant solution. The surfactant solution was 0.4 g/l solution of nonylphenoxypolyethoxy phosphate (commercially available from GAP Corp. as Gafac RE 610).

3. Immerse the base for one minute in an approximately 18 molar aqueous sulfuric acid solution.

4. Etch the base for 2 minutes at 60° C. in an aqueous solution of:
   Chromium (VI) trioxide 400 g/l
   sulfuric acid (96%) 250 ml/l
   anionic perfluoralkyl sulfonate 0.5 g/l (Commercially available from 3M Corp as FC 98.)

5. Immerse the base in an aqueous dragout solution.

6. Neutralize the residual chromium (VI) compounds on the base by immersion in an aqueous solution of 10 ml of 96% sulfuric acid and 40 ml of 33% hydrogen peroxide per liter.

7. Step 9 was repeated in a second neutralizer solution.

8. The molded base was rinsed in water.

After adhesion promotion, a reducible metal salt composition was applied to the molded base by the procedures of Polichette et al., U.S. Pat. Nos. 3,993,802 and 3,994,727, which are incorporated by reference. The base was immersed at 40° C. in an aqueous solution of:

Sorbitol: 220 g/l
2,6-anthraquinone disulfonic acid disodium salt: 16 g/l
cupric acetate: 8 g/l
cupric bromide: 0.5 g/l
Nonvlphenoxy polyethoxyethanol (Commercially-available as Surfactant 10G from Olin Corp.): 2 g/l The molded base was then dried at 82° C.

After drying the base, the base was enclosed in masks which are shown in FIGS. 2 and 3.

The base enclosed by the mask was exposed to ultra violet light on a Gyrex 912 PF Exposure Unit with two medium pressure mercury vapor lamps rated at 300 watts per linear inch. The two lamps were passed above and below the mask and enclosed base at 1.2 m/min. After the forward pass the mask and enclosed base were turned over for the reverse pass.

The mask was then removed and the unexposed reducible metal salt was removed by:

1. Immersing the molded base for five minutes in an aqueous solution of 40 g ethylenediamine tetracetic acid and 40 g of formaldehyde adjusted to pH 12.5 with sodium hydroxide.
2. Rinse.
3. Immerse in an aqueous solution of 40 g ethylenediaminetetracetic acid, 16 g formaldehyde, 0.5 g copper (II) sulfate pentahydrate adjusted to pH 12.5 with sodium hydroxide.
4. Rinse for one minute in water.

The base conductors were formed on the base by electroless deposition of copper on the areas which had been exposed to ultraviolet light. The electroless plating solution was copper sulfate: 0.04 moles/l
$N,N,N^1,N^1$-tetakris (2-hydroxypropyl ethylene diamine): 006 moles/l
Sodium Cyanide: 30 mg./l
Formaldehyde: 0.07 moles/l
Potassium Selanocyanate: 0.2 mg/l
nonyl phenoxy polyethoxy
phosphate surfactant: 0.14 g/l
pH (at 25° C.): 12.7
Temperature: 58° C.

The electroless plating solution was maintained by additions of copper sulfate, formaldehyde, $N,N,N^1,N^1$,-tetrakis (2-hydroxypropyl) ethylenediamine, sodium hydroxide, cyanide and selanocyanate for 4 hours of plating.

The molded base had copper conductors 2.5 micrometers thick deposied on the exposed areas forming a conductive pattern.

If thicker copper conductors are desired the electroless plating can be continued except that the formaldehyde concentration in the plating solution is preferably maintained at 0.045 moles per liter or less. Overcoats of nickel and or gold may be applied to the copper conduction by conventional techniques.

The conductive patterns had a peel strength over 5 lbs/inch and conductor widths were within 0.12 mm of the design width.

EXAMPLE II

Example I was repeated except that the base was molded of a polyethersulfone (commercially available as VICTREX P-200 Natural form ICI Americas, Wilmington, Delaware).

EXAMPLE III

Example I was repeated except that the base was molded of polyetherimide (commerially available, as Ultem 1000 from General Electric Co. Pittsfield, Massachusetts) and the swell step was performed in dimethylformamide at 60° C.

EXAMPLE IV

A polysulfone molded base was prepared which had a planar section which was 1.6 mm thick, 63.5 long and 50.8 mm. long; holes for through connection; and nine hollow cylindrical sections 5.08 mm in diameter with a wall thickness of 1.27 mm, the cylindrical section protrude 3.8 mm above one side of planar sections and 0.9 below the other side of the planar section An aluminum mask replicating this topography was provided which had openings corresponding to the conductive pattern desired. The conductive pattern included conductor rings on the top and bottom of the hollow cylindrical section and conductors 0.4 mm in width passing from the planar section 3.8 mm up the cyclinder walls to the top of the cylindrical section.

The molded bases were adapted from the conductive pattern and copper conductor patterns were formed by the procedures of Example 1. The conductor width of the conductors, including the 0.4 mm conductor traces on the walls of the cylindrical section, conformed to the design width of conductor within 0.12 mm.

EXAMPLE V

Example IV was repeated except that the base was molded of polyethersulfone.

EXAMPLE VI

Example IV was repeated except that the base was molded of polyetherimide and the swell procedure of Example III was used.

It is to be understood that the above-described embodiments are merely illustrative of the many possible specific embodiments which may be devised to represent application of the principles of the invention. Numerous and varied other arrangements can be devised in accordance with the principles by those skilled in the art without departing from the spirit and scope of the invention. For example, the use of a conformable mask allows a conductor on one surface to make a right angle up onto another surface. Still further, housings of many different types of electronic or electrical appliances, machines, or equipment can serve as a printed circuit boards as well as housing. Still further, various electrical connection, such as the socket of light emitting diodes (LED's) or light bulbs can be formed in a base member which eliminates the need to connect a separate socket. Still further, the masks could be fabricated using a variety of different materials. Still further, positive or negative photocatalysts could be used. Still further, the conductors can be of semiconductor material and semiconductor devices could be formed. Still further, multi-level conductor patterns can be formed with interconnection between layers. This can be accomplished by one or more physical features which rise above one surface of the base and having conductors running up same so as to interconnect the different conductor layers.

What is claimed is:

1. A process for forming a non-planar conduit pattern on at least one non-planar surface of a body which is adapted to be receptive to the formation of the conduit pattern by providing a catalyst on the surface which is chemically changed on exposure to radiation, said catalyst being a reducible salt of a non-noble metal, said process comprising steps of:

providing a mask which does not transmit said radiation and having a non-planar surface which is essentially a mirror image replica of the non-planar surface topography of a corresponding portion of the body on which the conduit pattern is to be formed, the mask having a preselected pattern of openings therein which correspond to the conduit pattern, at least one of the openings corresponding to a portion of the conduit pattern which is to be delineated on an irregular surface of the body;

placing the mirror image replica surface of the mask substantially in registry with the corresponding surface portion of said body; and exposing the catalyst on the surface of the body to the radiation through the openings in the mask so that the preselected pattern is essentially replicated on the surface of the body.

2. The process of claim 1, wherein the radiation is electromagnetic.

3. The process of claim 2, wherein the electromagnetic radiation is light.

4. The process of claim 3, wherein the light is ultra violet.

5. The process of claim 2, wherein the electromagnetic radiation is an electron beam or X-ray.

6. The process of claim 1 wherein the body also has at least one planar surface.

7. The process of claim 1 wherein the body also has at least one planar surface which is adapted to be receptive to the formation of a conduit pattern and said mask also has a planar surface which is essentially a mirror image replica of the planar surface topography of a corresponding portion of the body on which the conduit pattern is to be formed.

8. The process of claim 1 wherein said reducible salt is selected from the group consisting of reducible copper, nickel, cobalt and iron salts.

* * * * *